(12) United States Patent
Kim et al.

(10) Patent No.: US 9,974,172 B2
(45) Date of Patent: May 15, 2018

(54) EPOXY RESIN COMPOUND AND RADIANT HEAT CIRCUIT BOARD USING THE SAME

(75) Inventors: Hae Yeon Kim, Seoul (KR); Sung Bae Moon, Seoul (KR); Jae Man Park, Seoul (KR); Jeung Ook Park, Seoul (KR); Jong Heum Yoon, Seoul (KR); In Hee Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 224 days.

(21) Appl. No.: 14/241,961

(22) PCT Filed: Aug. 30, 2012

(86) PCT No.: PCT/KR2012/006919
§ 371 (c)(1),
(2), (4) Date: Jul. 16, 2014

(87) PCT Pub. No.: WO2013/032238
PCT Pub. Date: Mar. 7, 2013

(65) Prior Publication Data
US 2014/0318835 A1 Oct. 30, 2014

(30) Foreign Application Priority Data

Aug. 31, 2011 (KR) ........................ 10-2011-0088199

(51) Int. Cl.
| H05K 1/05 | (2006.01) |
| B32B 27/38 | (2006.01) |
| C08L 63/00 | (2006.01) |
| C09J 163/00 | (2006.01) |
| C08K 3/22 | (2006.01) |
| C08G 59/22 | (2006.01) |
| C08G 59/24 | (2006.01) |
| C08G 59/38 | (2006.01) |
| C08L 63/04 | (2006.01) |
| C09K 5/14 | (2006.01) |

(52) U.S. Cl.
CPC .......... *H05K 1/056* (2013.01); *C08G 59/226* (2013.01); *C08G 59/245* (2013.01); *C08G 59/38* (2013.01); *C08L 63/00* (2013.01); *C08L 63/04* (2013.01); *C09K 5/14* (2013.01)

(58) Field of Classification Search
None
See application file for complete search history.

(56) References Cited

U.S. PATENT DOCUMENTS

| 5,780,145 A * | 7/1998 | Hirano | C08K 7/18 361/746 |
| 5,798,400 A | 8/1998 | Tokunaga et al. | |
| 6,190,787 B1 | 2/2001 | Maeda et al. | |
| 2004/0048971 A1 | 3/2004 | Hayakawa et al. | |
| 2005/0208307 A1* | 9/2005 | Nikaido | C08G 59/3218 428/413 |
| 2006/0043382 A1* | 3/2006 | Matsui | H01L 25/0753 257/79 |
| 2007/0128772 A1* | 6/2007 | Yonemura | H01L 21/4857 438/129 |
| 2010/0101843 A1* | 4/2010 | Wakabayashi | C08F 220/18 174/258 |
| 2010/0164362 A1* | 7/2010 | Miyakawa | H05K 1/0274 313/498 |
| 2010/0202112 A1* | 8/2010 | Miyahara | H05K 1/0203 361/720 |

FOREIGN PATENT DOCUMENTS

| CN | 1143377 A | 2/1997 | |
| CN | 1236378 A | 11/1999 | |
| CN | 1487963 A | 4/2004 | |
| CN | 101974208 A | 2/2011 | |
| JP | 5267808 A | 10/1993 | |
| JP | 8-81542 A | * 3/1996 | |
| JP | 08-081542 A | 3/1996 | |
| JP | 2002-356538 A | * 12/2002 | ............. C08G 59/38 |
| JP | 2006-063207 A | * 3/2006 | ............. C08G 59/24 |
| JP | 2007-308570 A | * 11/2007 | |
| JP | 2007-308570 A | 11/2007 | |
| JP | 2008-156403 A | * 7/2008 | |
| JP | 2008-156403 A | 7/2008 | |
| KR | 10-2007-0009621 A | 1/2007 | |
| WO | WO-2012/161490 A2 | 11/2012 | |

OTHER PUBLICATIONS

Nippon Kayaku, "Epoxy Resins Reactive Flame Retartants Hardeners", 2016, 11 pages.*
Machine translation of JP 2002-356538 A (no date).*
Machine translation of JP 2006-063207 A (no date).*
Machine translation of JP 2007-308570 A (no date).*
Office Action dated Aug. 11, 2015 in Chinese Application No. 201280053423.9.
Office Action dated May 13, 2014 in Taiwanese Application No. 101149266.
International Search Report in International Application No. PCT/KR2012/006919, filed Aug. 30, 2012.

* cited by examiner

*Primary Examiner* — Michael J Feely
(74) *Attorney, Agent, or Firm* — Saliwanchik, Lloyd & Eisenschenk

(57) ABSTRACT

An epoxy resin compound having an epoxy resin, a curing agent, and inorganic filler as main components is provided. The epoxy resin includes an epoxy resin of Chemical Formula. Accordingly, the thermal conductivity of the epoxy resin compound can be increased because the epoxy resin has a mesogen structure that facilitates crystallizability. In addition, a high radiant heat board can be provided by using the above-mentioned epoxy resin as an insulating material for a printed circuit board.

17 Claims, 1 Drawing Sheet

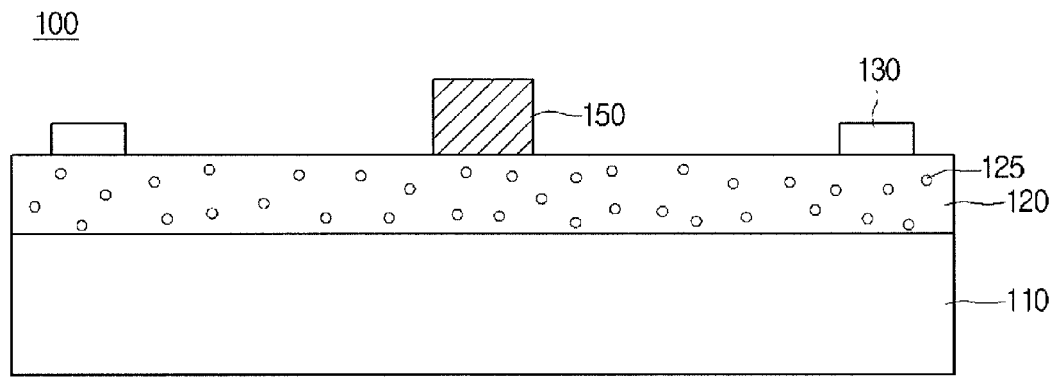

EPOXY RESIN COMPOUND AND RADIANT HEAT CIRCUIT BOARD USING THE SAME

CROSS-REFERENCE TO RELATED APPLICATIONS

This application is the U.S. national stage application of International Patent Application No. PCT/KR2012/006919, filed Aug. 30, 2012, which claims priority to Korean Application No. 10-2011-0088199, filed Aug. 31, 2011, the disclosures of each of which are incorporated herein by reference in their entirety.

TECHNICAL FIELD

The present disclosure relates to an epoxy resin compound, and more particularly, to an epoxy resin for an insulating layer of a radiant heat circuit board.

BACKGROUND ART

A circuit board includes an electric insulation board and a circuit pattern formed on the electric insulation board. Such a circuit board is used for mounting components such as electronic components thereon.

Such electronic components may include a heat-generating device such as a light emitting diode (LED) that generates a large amount of heat. Heat generated from such as a heat-generating device increases the temperature of a circuit board and causes malfunction and reliability problems of the heat-generating device.

Accordingly, a radiant heat structure is important for dissipating heat from an electronic component to the outside of a circuit board, and the thermal conductivity of an insulating layer formed on the circuit board has a large influence on heat dissipation. The thermal conductivity of an insulating layer can be increased by filling an inorganic filler in the insulating layer at a high density, and an epoxy resin having a low viscosity is proposed as an inorganic filler.

DISCLOSURE OF INVENTION

Technical Problem

Resins such as Bisphenol A type epoxy resin and bisphenol F type epoxy resin are generally used as low viscosity epoxy resins. Since such epoxy resins are difficult to handle because such epoxy resins are liquid at room temperature and are disadvantageous in terms of heat resistance, mechanical strength, and toughness.

Solution to Problem

Embodiments provide an epoxy resin compound including an epoxy resin, a curing agent, and inorganic filler, wherein the epoxy resin includes an epoxy resin of the following Chemical Formula.

Embodiments also provide a radiant heat circuit board including a metal plate, an insulating layer on the metal plate, and a circuit pattern on the insulating layer, in which the insulting layer is formed by curing an epoxy resin compound including an epoxy resin, a curing agent, and inorganic filler as main components, and the epoxy resin includes the epoxy resin of the above Chemical Formula.

According to the present disclosure, thermal conductivity can be increased by using the epoxy resin having a mesogen structure that facilitates crystallizability. In addition, a high radiant heat board can be provided by using the epoxy resin as an insulating material for a printed circuit board.

In addition, the epoxy resin has high thermal conductivity, low absorbency, low thermal expansibility, and high heat resistance.

The details of one or more embodiments are set forth in the accompanying drawings and the description below. Other features will be apparent from the description and drawings, and from the claims.

Advantageous Effects of Invention

Embodiments provide an epoxy resin compound having a new composition ratio. Embodiments provide a radiant heat circuit board with an improved thermal efficiency.

BRIEF DESCRIPTION OF DRAWINGS

FIG. 1 is a cross-sectional view illustrating a radiant heat circuit board according to an embodiment.

MODE FOR THE INVENTION

Embodiments will now be described in detail with reference to the accompanying drawings in such a manner that the technical idea of the present disclosure may easily be carried out by a person of ordinary skill in the art. However, the scope and spirit of the present disclosure are not limited to the embodiments but can be realized in different forms.

In the specification, when it is described that one comprises (or includes or has) some elements, it should be understood that it may comprise (or include or have) only those elements, or it may comprise (or include or have) other elements as well as those elements if there is no specific limitation.

In the drawings, regions not relating to descriptions are omitted for clarity in description, and layers and regions are exaggerated for clarity. Throughout the specification, like reference numerals denote like elements.

It will be understood that when a layer, a film, a region, or a plate is referred to as being on another layer, film, region, or plate, it can be directly on the other layer, film, region, or plate, or intervening layers, films, regions, or plates may also be present. However, if a layer, a film, a region, or a plate is referred to as being directly on another layer, film, region, or plate, there is not intervening layer, film, region, or plate.

The present disclosure provides an epoxy resin compound having an improved thermal conductivity owing to high crystalline characteristics.

The crystalline epoxy resin compound of the present disclosure includes an epoxy resin, a curing agent, and an inorganic filler as main components.

The epoxy resin may include at least 12 wt % of crystalline epoxy resin. For example, the epoxy resin may include at least 50 wt % of crystalline epoxy resin.

The crystalline epoxy resin is expressed by the following Chemical Formula.

Chemistry Figure 1

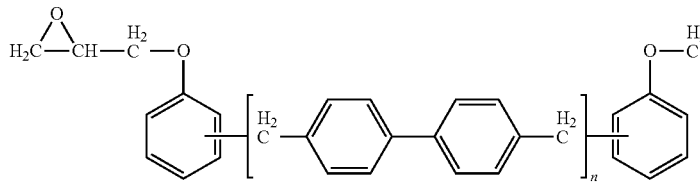

[Chem.1]

In Chemical Formula, n may be an integer of 0 to 10.

If the content of the crystalline epoxy resin is less than the above-mentioned value, effects such as an increase in thermal conductivity are reduced because the epoxy resin is not crystallized when hardened.

The epoxy resin further includes a general amorphous epoxy resin in which a molecule has at least two epoxy groups as well as the crystalline epoxy resin which is an essential component.

Examples of the amorphous epoxy include: bisphenol A; 3,3',5,5'-tetramethyl-4,4'-dihydroxydiphenylmethane; 4,4'-dihydroxydiphenylsulfone; 4,4'-dihydroxydiphenylsulfide; 4,4'-dihydroxydiphenylketone; fluorenbisphenol; 4,4'-biphenol,3,3',5,5'-tetramethyl-4,4'-dihydroxybiphenyl; 2,2'-biphenol; resorcin; catechol; t-butylcatechol; hydroquinone; t-butylhydroquinone; 1,2-dihydroxynaphthalene; 1,3-dihydroxynaphthalene; 1,4-dihydroxynaphthalene; 1,5-dihydroxynaphthalene; 1,6-dihydroxynaphthalene; 1,7-dihydroxynaphthalene; 1,8-dihydroxynaphthalene; 2,3-dihydroxynaphthalene; 2,4-dihydroxynaphthalene; 2,5-dihydroxynaphthalene; 2,6-dihydroxynaphthalene; 2,7-dihydroxynaphthalene; 2,8-dihydroxynaphthalene; allylated compounds or polyallylated compounds of the dihyroxynaphthalene; divalent phenols such as allylated bisphenol A, allylated bisphenol F, allylated phenol novolac; phenols having a valence of three or more such as phenol novolac, bisphenol A novolac, o-cresol novolac, m-cresol novolac, p-cresol novolac, Xylenole novolac, poly-p-hydroxysyrene, tris-(4-hydroxyphenyl)methane, 1,1,2,2-tetrakis(4-hydroxyphenyl)ethane, fluoroglycinol, pyrogallol, t-butylpyrogallol, allylated pyrogallol, polyallylated pyrogallol, 1,2,4-benzenetriol, 2,3,4-trihydroxybenzophenon, phenolaralkyl resin, naphthol aralkyl resin, dicyclophenadiene-based resin; and glycidyl etherficated compounds derived from halogenated bisphenols such as tetrabromobisphenol A. For example, the epoxy resin may include a combination of two or more of the listed amorphous epoxy resins.

The curing agent used for the epoxy resin compound of the present disclosure may be any of generally known epoxy resin curing agent. For example, the curing agent may be a phenol-based curing agent.

The phenol-based curing agent includes a phenol resin in addition to a phenol compound.

Examples of the phenol-based curing agent includes bisphenol A, bisphenol F, 4,4-dihydroxydiphenylmethane, 4,4-dihydroxyphenylether, 1,4-bis(4-hydroxyphenoxy)benzene, 1,3-bis(4-hydroxyphenoxy)benzene, 4,4-dihydroxydiphenylsulfide, 4,4-dihydroxydiphenylketone, 4,4-dihydroxydiphenylsulfone, 4,4-dihydroxybiphenyl, 2,2-dihydroxybiphenyl, 10-(2,5-dihydroxyphenyl)-10H-9-oxa-10-phosphaphenanthrene-10-oxide, phenol novolac, bisphenol A novolac, o-cresol novolac, m-cresol novolac, p-cresol novolac, Xylenole novolac, poly-p-hydroxysyrene, hydroquinone, resorsin, catechol, t-butylcatechol, t-butyl hydroquinone, fluoroglycinol, pyrogallol, t-butylpyrogallol, allylated pyrogallol, polyallylated pyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, allylated compounds or polyallylated compounds of the dihyroxynaphthalene, allylated bisphenol A, allylated bisphenol F, allylated phenol novolac, and allylated pyrogallol.

At least two curing agents may be mixed and then used as the curing agent.

Meanwhile, a generally known curing agent may be used in addition to the phenol-based curing agent. Examples of generally known curing agent include an amine-based curing agent, an acid anhydride-based curing agent, a phenol-based curing agent, a polymercaptan-based curing agent, a polyaminoamide-based curing agent, an isocyanate-based curing agent, and a block isocyanate-based curing agent. The mixing ratio of the above curing agents may be properly selected according to the type of curing agent to be mixed or physical properties of a thermal conductive epoxy resin product.

Examples of the amine-based curing agent include aliphatic amines, polyetherpolyamines, cycloaliphatic amines, and aromatic amines. Examples of the aliphatic amines include ethylene diamine, 1,3-diaminopropane, 1,4-diaminopropane, hexamethylenediamine, 2,5-dimethylhexamethylenediamine, trimethylhexamethylenediamine, diethylenetriamine, aminobispropylamine, bis(hexamethylene)triamine, triethylenetetramine, tetraethylenephentamine, pentaethylenehexamine, N-hydroxyethylethylenediamine, and tetra(hydroxyethyl)ethylenediamine. Examples of the polyetherpolyamines include triethyleneglycoldiamine, tetraethyleneglycoldiamine, diethyleneglycolbis(propylamine), polyoxypropylenediamine, and polyoxypropylenetriamines. Examples of the cycloaliphatic amines include isophorone diamine, metacendiamine, N-aminoethylpiperazine, bis(4-amino-3-methyldicyclohexyl)methane, bis(aminomethyl)cyclohexane, 3,9-bis(3-aminopropyl)2,4,8,10-tetraoxaspiro(5,5)undecane, and norbornen diamine. Examples of the aromatic amines include tetrachloro-p-xylylenediamine, m-xylylenediamine, p-xylylenediamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenylsulfone, 4,4'-diaminodiphenylsulfone, m-aminophenol, m-aminobenzylamine, benzyldimethylamine, 2-dimethylaminomethyl)phenol, triethanolphenol, methylbenzylamine, -(m-aminophenyl)ethylamine, -(p-aminophenyl)ethylamine, diaminodiethyldimethyldiphenylmethane, and,'-bis(4-aminophenyl)-p-diisopropylbenzene.

Examples of the acid anhydride curing agent include dodecenyl succinic anhydride, polyadipic acid anhydride, polyazellainc acid anhydride, polysebacic acid anhydride, poly(ethyloctadecanoic acid)anhydride, poly(phenylhexadecanoic acid)anhydride, methyltetrahydro phthalic anhydride, methylhexahydro phthalic anhydride, hexahydro phthalic anhydride, anhydrous methyl hymic acid, tetrahydro phthalic anhydride, trialkyltetrahydro phthalic anhydride, methylcyclohexenedicarbonic acid anhydride, methylcyclohexenetetracarbonic acid anhydride, phthalic anhydride, anhydrous trimellitic acid, anhydrous pyromellitic acid, benzophenone tetracarbonic acid anhydride, ethylene glycol bistrimellitate, hetic anhydride, nadic anhydride, anhydrous methyl nadic acid, 5-(2,5-dioxotetrahydro-3-furanyl)-3-methyl-3-cyclohexane-1,2-dicarbonic acid anhydride, 3,4-dicarboxy-1,2,3,4-tetrahydro-1-naphthalene succinic acid dianhydride, and 1-methyl-dicarboxy-1,2,3,4-tetrahydro-1-naphthalene succinic acid dianhydride.

The epoxy resin compound includes 40 wt % to 97 wt % of the inorganic filler.

When the content of the inorganic filler is lower than the above range, it may be difficult to attain effects of the present disclosure such as high thermal conductivity, low thermal expansibility, and high thermal resistance. The more the content of inorganic filler is included; the above-mentioned effects can be attained but are not improved in proportion to the volume fraction of the inorganic filler. That is, the above-mentioned effects are significantly improved from a specific content of the inorganic filler. The above-described mentioned effects are obtained by controlled high order structure in a polymer state. It seems that a specific content of the inorganic filler is necessary because the higher order structure is mainly achieved on the surface of the inorganic filler. Meanwhile, when the content of the inorganic filler is greater than the above range, the viscosity of the epoxy resin compound may increase to make it difficult to form the epoxy resin compound in a desired shape.

The inorganic filler may have a globular shape. The shape of the inorganic filler is not limited as long as the inorganic filler has a globular shape. For example, the inorganic filler may have an elliptical sectional shape. However, as the shape of the inorganic filler is close to a perfect globular shape, the fluidity of the epoxy resin compound improves.

The inorganic filler may be alumina, aluminum nitride, silicon nitride, boron nitride, or crystalline silica, and the like. In addition, two or more different inorganic fillers may be used in combination as the inorganic filler.

The average particle diameter of the inorganic filler may be less than 30. When the average particle diameter is above the above range, the fluidity and strength of the epoxy resin compound are decreased.

The epoxy resin compound of the present disclosure may be mixed with a known curing accelerator. Examples of the curing accelerator include amines, imidazoles, organic phosphines, and Lewis acids. Specifically, examples of the curing accelerator may include: tertiary amines such as 1,8-diazabicyclo(5,4,0)undecene-7, triethylenediamine, benzyldimethylamine, triethanolamine, dimethylaminoethanol, and tris(dimethylaminomethyl)phenol; imidazoles such as 2-methylimidazole, 2-phenylimidazole, 2-phenyl-4-methylimidazole, and 2-heptadecylimidazole; organic phosphines such as tributylphosphine, methyldiphenylphosphine, triphenylphosphine, diphenylphosphine, and phenylphosphine; and tetra substituted phosphoniumtetra substituted borate such as tetraphenylphosphoniumtetraphenylborate, tetraphenylphosphoniumethyltriphenylborate, and tetrabutylphosphoniumtetrabutylborate; and tetraphenylboron salts such as 2-ethyl-4-methylimidazoletetraphenylborate, and N-methylmorphorlintetraphenylborate.

General wax may be used as a release agent for wax may be used as a release agent for the epoxy resin compound of the present disclosure. Examples of the wax include stearic acid, montanic acid, montanic acid ester, and phosphoric acid ester.

For the epoxy resin compound of the present disclosure, a coupling agent that is generally used for an epoxy resin compound may be used so as to improve the adhesion strength between the inorganic filler and the resin component. Examples of the coupling agent include an epoxy silane.

When the epoxy resin compound of the present disclosure includes the epoxy resin, the curing agent, and the inorganic filler as main components, the epoxy resin compound includes 3 wt % to 60 wt % of the epoxy resin, 40 wt % to 97 wt % of the inorganic filler, and 0.5 wt % to 5 wt % of the curing agent. The epoxy resin, the curing agent, and other components are dissolved in a solvent such as acetone, MEK, MIBK, IPA, butanol, or toluene and are agitated while applying heat. Then, then the inorganic filler is added to the solution is uniformly mixed using a device such as a mixer. Thereafter, the coupling agent is added to the mixture and the mixture is kneaded using a device such as a heating roll and a kneader. The mixing order of the above components is not limited.

At this time, the solvent is used in 10 wt % to 20 wt % based on the total weight of the epoxy resin compound.

The epoxy resin compound of the present disclosure may be applied to a radiant heat circuit board 100 as shown in FIG. 1.

Referring to FIG. 1, the radiant heat circuit board 100 of the present disclosure includes a metal plate 110, an insulating layer 120 on the metal plate 110, circuit patterns 130 on the insulating layer 120.

The metal plate 110 may be formed of one of alloys including copper, aluminum, nickel, gold, platinum, and the like that have good thermal conductivity.

The metal plate 110 may include a metal projection (not shown) that constitutes a mounting pad on which a heat-generating device 150 is mounted.

The metal projection may extend vertically from the metal plate 110. The heat-generating device 150 is mounted on a portion of the topside of the metal projection, and the portion of the topside of the metal projection has a predetermined width so that solder balls can be placed.

The insulating layer 120 is disposed on the metal plate 110.

The insulating layer 120 may include a plurality of insulating layers. The insulating layer 120 is disposed between the metal plate 110 and the circuit patterns 130.

The insulating layer 120 may be formed by curing the above-described crystalline epoxy resin compound. An inorganic filler 125 is evenly dispersed in the insulating layer 120.

The circuit patterns 130 are disposed on the insulating layer 120.

Since the insulating layer 120 is formed of the above-described crystalline epoxy resin compound, the thermal conductivity of the insulating layer 120 is increased so that heat generated from the heat-generating device 150 can be transferred to the metal plate 110 through the insulating layer 120.

EXAMPLES

Hereinafter, the scope and spirit of the present disclosure will be explained in more detail with reference to Examples.

Example 1

All of 3.8 wt % of Bisphenol-F, 4.2 wt % of crystalline epoxy resin of Chemical Formula 1(n=1), 1.0 wt % of biphenyl curing agent, 0.1 wt % of triphenylphosphine oxide curing accelerator, and 0.9 wt % of BYK-W980 additive were mixed; stirred at 40 for 10 minutes; then 90.0 wt % of alumina inorganic filler was added; and then stirred at room temperature for 20 to 30 minutes to obtain a crystalline epoxy resin compound of Example 1.

The thermal conductivity of the epoxy resin compound was measured by a unsteady hot wire method using LFA447 Type thermal conductivity meter available from NETZSCH Company.

The glass transition temperature of the epoxy resin compound was measured at a temperature increasing rate of 10/minute by using a DSC Q100 Thermo-mechanical measuring device available from TA Company.

Example 2

All of 3.8 wt % of Bisphenol-A o-cresol-novolac, 4.2 wt % of crystalline epoxy resin of Chemical Formula 1(n=1), 1.0 wt % of biphenyl curing agent, 0.1 wt % of triphenylphosphine oxide curing accelerator, and 0.9 wt % of BYK-W980 additive were mixed; stirred at 40 for 10 minutes; then 82.3 wt % of alumina inorganic filler was added; and then stirred at room temperature for 20-30 minutes to obtain a crystalline epoxy resin compound of Example 2.

Example 3

All of 12.4 wt % of Bisphenol-F, 13.6 wt % of crystalline epoxy resin of Chemical Formula 1(n=1), 3.0 wt % of biphenyl curing agent, 0.3 wt % of triphenylphosphine oxide curing accelerator, and 0.7 wt % of BYK-W980 additive were mixed; stirred at 40 for 10 minutes; then 70.0 wt % of alumina inorganic filler was added; and then stirred at room temperature for 20 to 30 minutes to obtain a crystalline epoxy resin compound of Example 3.

Example 4

All of 8.1 wt % of Bisphenol-F, 8.9 wt % of crystalline epoxy resin of Chemical Formula 1(n=1), 2.0 wt % of biphenyl curing agent, 0.2 wt % of triphenylphosphine oxide curing accelerator, and 0.8 wt % of BYK-W980 additive were mixed; stirred at 40 for 10 minutes; then 80.0 wt % of alumina inorganic filler was added; and then stirred at room temperature for 20 to 30 minutes to obtain a crystalline epoxy resin compound of Example 4.

Example 5

All of 8.1 wt % of Bisphenol-F, 8.9 wt % of crystalline epoxy resin of Chemical Formula 1(n=1), 2.0 wt % of phenol novolac curing agent, 0.2 wt % of 2-methyl imidazole-based curing accelerator, and 0.2 wt % of BYK-W980 additive were mixed; stirred at 40 for 10 minutes; then 80.0 wt % of alumina inorganic filler was added; and then stirred at room temperature for 20 to 30 minutes to obtain a crystalline epoxy resin compound of Example 5.

Example 6

All of 1.9 wt % of Bisphenol-A, 4.2 wt % of crystalline epoxy resin of Chemical Formula 1(n=1), 1.0 wt % of biphenyl curing agent, 0.1 wt % of triphenylphosphine oxide curing accelerator, and 0.9 wt % of BYK-W980 additive were mixed; stirred at 40 for 10 minutes; then 90.0 wt % of alumina inorganic filler was added; and then stirred at room temperature for 20 to 30 minutes to obtain a crystalline epoxy resin compound of Example 6.

Comparative Example 1

All of 3.8 wt % of Bisphenol-F, 4.2 wt % of o-cresol-novolac, 1.0 wt % of biphenol-based curing agent, 0.1 wt % of triphenylphosphine oxide curing accelerator, and 0.9 wt % of BYK-W980 additive were mixed; stirred at 40 for 10 minutes; then 90.0 wt % of alumina inorganic filer was added; and then stirred at room temperature for 20 to 30 minutes to obtain an epoxy resin compound of Comparative Example 1.

Comparative Example 2

All of 3.8 wt % of Bisphenol-A, 4.2 wt % of o-cresol-novolac, 1.0 wt % of biphenol-based curing agent, 0.1 wt % of triphenylphosphine oxide curing accelerator, and 0.9 wt % of BYK-W980 additive were mixed; stirred at 40 for 10 minutes; then 90.0 wt % of alumina inorganic filer was added; and then stirred at room temperature for 20 to 30 minutes to obtain an epoxy resin compound of Comparative Example 2.

Experimental Example

Measurement of Thermal Conductivity

Thermal conductivities of each Example and Comparative Example were measured by an unsteady hot wire method using LFA447 Type thermal conductivity meter available from NETZSCH Company, and the measured results are shown in Table 1.

Measurement of Heat of Melting

Melting heat was measured at a temperature increasing rate of 10/minute using a differential scanning calorimeter (DSC Q100 available from TA Company), and the measured results are shown in Table 1. The melting heat is similar in each Example and Comparative Example.

Glass Transition Temperature

Glass transition temperatures were measured at a temperature increasing rate of 10/minute by using a DSC Q100 Thermo-mechanical measuring device available from TA Company, and the measured results are shown in Table 1. The glass transition temperatures are at least 100. That is, other properties are not deteriorated although a crystalline epoxy resin is added.

TABLE 1

| Experiment No. | Thermal Conductivity (W/m · K) | Glass Transition Temperature Tg(° C.) | Heat of Melting(J/g) |
|---|---|---|---|
| Example 1 | 4.1 | 145.2 | 271.3 |
| Example 2 | 3.7 | 140.7 | 278.1 |
| Example 3 | 2.5 | 144.7 | 273.5 |
| Example 4 | 3.6 | 146.3 | 275.1 |
| Example 5 | 3.2 | 139.8 | 265.1 |
| Example 6 | 3.8 | 142.1 | 276.6 |
| Comparative Example 1 | 3.8 | 137.2 | 269.9 |
| Comparative Example 2 | 3.2 | 132.1 | 261.3 |

Referring to Table 1, in Example 1, Comparative Example 1 and Comparative Example 2 where the same amount of inorganic filler was used, the thermal conductivity of the crystalline epoxy resin compound of Example 1 including a crystalline epoxy resin is higher than the thermal conductivity of the epoxy resin compound of Comparative Examples 1 and 2.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An epoxy resin compound for an insulating layer of a radiant heat circuit board comprising an epoxy resin, at least two curing agents, and an inorganic filler;
    wherein the epoxy resin comprises a crystalline epoxy resin and an amorphous epoxy resin;
    wherein the epoxy resin includes at least 12 wt % of the crystalline epoxy resin and a balance of the epoxy resin is the amorphous epoxy resin;
    wherein the crystalline epoxy resin is expressed as the following chemical formula:

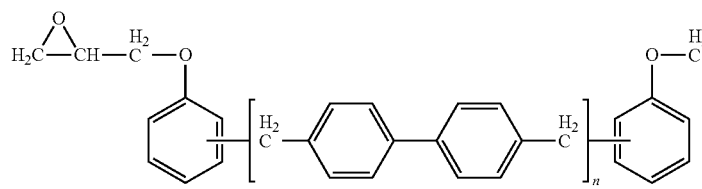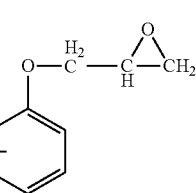

[Chemical Formula]

where n=1;
    wherein the crystalline epoxy resin has a mesogen structure;
    wherein the amorphous epoxy resin comprises a molecule with at least two epoxy groups;
    wherein the inorganic filler is alumina;
    wherein a first curing agent includes a phenol-based curing agent,
    wherein a second curing agent includes a polymercaptan-based curing agent, a polyaminoamide-based curing agent, an isocyanate-based curing agent, or a block isocyanate-based curing agent;
    wherein the inorganic filler is evenly dispersed in the epoxy resin compound,
    wherein a weight ratio of the crystalline epoxy resin is different from a weight ratio of the amorphous epoxy resin, and
    wherein a glass transition temperature Tg of the epoxy resin compound is within a range of from 139.8° C. to 146.3° C.

2. The epoxy resin compound according to claim 1, wherein the epoxy resin compound comprises more than 50 wt % of the crystalline epoxy resin of the chemical formula based on a total weight of the epoxy resin.

3. The epoxy resin compound according to claim 1, wherein the epoxy resin compound comprises 40 wt % to 97 wt % of the inorganic filler based on a total weight of the epoxy resin compound.

4. The epoxy resin compound according to claim 1, wherein the epoxy resin compound comprises 3 wt % to 60 wt % of the epoxy resin based on a total weight of the epoxy resin compound.

5. The epoxy resin compound according to claim 1, wherein the epoxy resin compound comprises 0.5 wt % to 5 wt % of the curing agent based on a total weight of the epoxy resin compound.

6. The epoxy resin compound according to claim 1, wherein the epoxy resin compound further comprises a curing accelerator, a coupling agent, and a solvent.

7. The epoxy resin compound according to claim 6, wherein the coupling agent includes an epoxy silane.

8. The epoxy resin compound according to claim 6, wherein the solvent used is 10 wt % to 20 wt % based on the total weight of the epoxy resin compound.

9. The epoxy resin compound according to claim 1, wherein the amorphous epoxy resin comprises at least two amorphous epoxy resins.

10. The epoxy resin compound according to claim 9, wherein the amorphous epoxy resin comprises bisphenol-A and bisphenol-F.

11. The epoxy resin compound according to claim 1, wherein an average particle diameter of the inorganic filler is less than 30 μm, and
    wherein the inorganic filler has a globular shape.

12. A radiant heat circuit board comprising:
    a metal plate;
    an insulating layer that is entirely applied on one surface of the metal plate; and
    a LED heat-generating device and a circuit pattern on the insulating layer;
    wherein the metal plate is formed of an alloy including at least one of copper, aluminum, nickel, gold, and platinum;
    wherein the metal plate and the insulating layer have a plate shape, wherein the insulating layer is in direct contact with the metal plate;
wherein the circuit pattern is in direct contact with the insulating layer;
wherein the LED heat-generating device is in direct contact with the insulating layer;
wherein the insulating layer is formed by curing an epoxy resin compound comprising an epoxy resin, at least two curing agents, and an inorganic filler;
wherein the epoxy resin comprises a crystalline epoxy resin and an amorphous epoxy resin;
wherein the epoxy resin includes at least 12 wt % of the crystalline epoxy resin and a balance of the epoxy resin is the amorphous epoxy resin;
wherein the crystalline epoxy resin is represented by the following chemical formula:

[Chemical Formula]

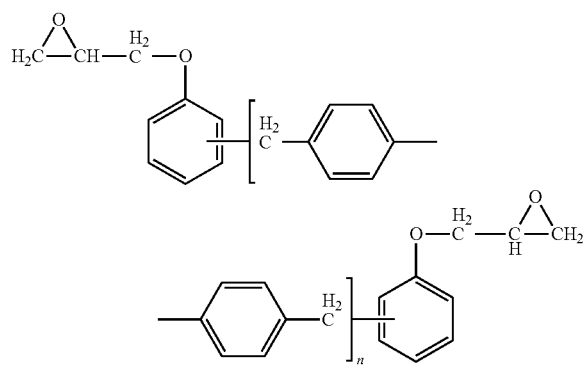

where n=1;
wherein the crystalline epoxy resin has a mesogen structure;
wherein the amorphous epoxy resin comprises a molecule with at least two epoxy groups;
wherein the inorganic filler is alumina;
wherein a first curing agent includes a phenol-based curing agent,
wherein a second curing agent includes a polymercaptan-based curing agent, a polyaminoamide-based curing agent, an isocyanate-based curing agent, or a block isocyanate-based curing agent;
wherein the inorganic filler is evenly dispersed in the insulating layer;
wherein the inorganic filler is evenly dispersed in the epoxy resin compound,
wherein a weight ratio of the crystalline epoxy resin is different from a weight ratio of the amorphous epoxy resin, and
wherein a glass transition temperature Tg of the epoxy resin compound is within a range of from 139.8° C. to 146.3° C.

13. The radiant heat circuit board according to claim 12, wherein the epoxy resin compound comprises 40 wt % to 97 wt % of the inorganic filler based on a total weight of the epoxy resin compound.

14. The radiant heat circuit board according to claim 12, wherein the metal plate includes a metal projection, and wherein the metal projection extends vertically from the metal plate.

15. The radiant heat circuit board according to claim 12, wherein the insulating layer comprises a plurality of insulating layers.

16. The radiant heat circuit board according to claim 12, wherein the insulating layer is disposed between the metal plate and the circuit pattern, and
wherein the circuit pattern and a heat-generating device are disposed on the insulating layer.

17. The radiant heat circuit board according to claim 12, wherein an average particle diameter of the inorganic filler is less than 30 μm, and
wherein the inorganic filler has a globular shape.

* * * * *